(12) United States Patent
Boomen et al.

(10) Patent No.: US 8,541,786 B2
(45) Date of Patent: Sep. 24, 2013

(54) PACKAGED SEMICONDUCTOR DEVICE HAVING IMPROVED LOCKING PROPERTIES

(75) Inventors: Rene Wilhelmus Johannes Maria van den Boomen, Asten (NL); Jan van Kempen, Cuyk (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/164,268

(22) Filed: Jun. 20, 2011

(65) Prior Publication Data
US 2011/0309514 A1 Dec. 22, 2011

(30) Foreign Application Priority Data

Jun. 22, 2010 (EP) .................................... 10166815

(51) Int. Cl.
*H01L 29/00* (2006.01)

(52) U.S. Cl.
USPC .................. 257/73; 257/E23.02; 257/E23.021

(58) Field of Classification Search
USPC ................................ 257/73, E23.02, E23.021
See application file for complete search history.

(56) References Cited

U.S. PATENT DOCUMENTS

| 6,602,775 B1 | 8/2003 | Chen et al. |
| 7,518,220 B2 | 4/2009 | Kroehnert et al. |
| 2003/0194855 A1* | 10/2003 | Park et al. ..................... 438/614 |
| 2006/0097366 A1 | 5/2006 | Sirinorakul et al. |
| 2006/0105560 A1 | 5/2006 | Tseng et al. |
| 2008/0169559 A1* | 7/2008 | Yang ............................. 257/737 |
| 2009/0039486 A1 | 2/2009 | Shimazaki et al. |

FOREIGN PATENT DOCUMENTS

| DE | 102005003390 A1 | 7/2006 |
| EP | 2337068 A1 | 6/2011 |

OTHER PUBLICATIONS

"The International Technology Roadmap for Semiconductors," 2011.
HD Semitech, "What is QFN (MLP, MLF)," available at http://www.hdsemitech.com/query/upload/1116489164.pdf.
Freescale Semiconductor, Application Note, "Quad Flat Pack No-Lead (QFN) Micro Dual Flat Pack No-Lead (uDFN)," AN1902, Rev 4.0, Sep. 2008.
Ramos, et al., "The Method of Making Low-Cost Multiple-Row QFN," Unisem, Proc. 32nd Int. Electron. Manuf. Technol. Symp., San Jose, CA, USA, 2007, pp. 257-263.
Extended European Search Report, EP Application No. 10166815.0, EPO, Mar. 2011.

* cited by examiner

*Primary Examiner* — Long Pham
*Assistant Examiner* — Steven Rao

(57) ABSTRACT

The invention relates to semiconductor devices and methods of manufacturing. In certain embodiments, a semiconductor device can include: a) a contact pad with pre-shaped sidewalls; b) a semiconductor chip having a terminal that is electrically connected to the contact pad, and c) a protective compound covering the semiconductor chip and at least part of the sidewalls. The sidewall can be rough or the sidewall can be tapered to facilitate locking of the contact pad into the compound.

19 Claims, 6 Drawing Sheets

PACKAGED SEMICONDUCTOR DEVICE HAVING IMPROVED LOCKING PROPERTIES

CROSS-REFERENCE TO RELATED APPLICATIONS

This application claims the priority under 35 U.S.C. §119 of European patent application no. 10166815.0, filed on Jun. 22, 2010, the contents of which are incorporated by reference herein.

FIELD OF THE INVENTION

The invention relates to a method of manufacturing a packaged semiconductor device having a higher reliability, and in particular to the packing of such semiconductor device in the surface-mount technology field. The invention further relates to such semiconductor device, and to a printed-circuit board comprising such semiconductor device.

BACKGROUND OF THE INVENTION

The International Technology Roadmap for Semiconductors is a set of documents produced by a group of semiconductor industry experts. These experts are representative of the sponsoring organizations which include the Semiconductor Industry Associations of the US, Europe, Japan, Korea and Taiwan. The documents represent best opinion on the directions of research into the following areas of technology, including time-lines up to about 15 years into the future: System Drivers/Design, Test & Test Equipment, Front End Processes, Photolithography, IC Interconnects, Factory Integration, Assembly & Packaging, Environment, Safety & Health, Yield Enhancement, Metrology, Modeling & Simulation, Emerging Research Devices, and Emerging Research Materials.

In order to keep pace with the ITRS roadmap a strong focus on packaging is visible in the prior art, and in particular in the surface-mount technology (SMT). Within this field Quad Flat Packages (QFP) have been very popular for a long time. A QFP is an integrated circuit package with leads extending from each of the four sides. It has been primarily used for surface mounting (SMD). In the prior art versions have been reported in the range from 32 to over 200 pins with a pitch ranging from 0.4 to 1.0 mm. Special cases include Low-profile (LQFP) and Thin-QFP (TQFP). The QFP package type became common in Europe and US during the early nineties, but QFP components have been used in Japanese consumer electronics since the seventies, most often mixed with hole-mounted, and sometimes socketed, components on the same printed circuit board.

Quad-Flat-No-leads (QFN) or Microleadframe (MLF) packages physically and electrically connect integrated circuits to printed circuit boards. QFN is a surface-mount technology, one of several package technologies that connect ICs to the surfaces of PCBs without through-holes. The QFN package is similar to the Quad Flat Package, but in QFN packages the terminals/leads are mainly at the package bottom side and do not or only slightly extend out from the package sides. This is a near chip scale package (CSP) plastic encapsulated package made with a planar copper lead frame substrate. Perimeter lands on the package bottom provide electrical connections to the PCB. In most cases the package includes an exposed thermal pad to improve heat transfer out of the IC (into the PCB). Heat transfer can be further facilitated by metal vias in the thermal pad.

A lot of information on QFN can be found on internet, such as on the following links:
http://www.hdsemitech.com/query/upload/1116489164.pdf
http://freescale.com/files/analog/doc/app note/AN1902.pdf
http://www.unisemgroup.com/pdf/articles/8 29 Low Cost Multiple RowELP.pdf Non-pre-published European patent application 09179896.7 discloses a method of manufacturing a semiconductor device, the method comprising: i) providing a substrate carrier comprising a substrate and a patterned conductive layer, wherein the patterned conductive layer defines contact pads; ii) partially etching the substrate carrier using the patterned conductive layer as a mask defining contact regions in the substrate; iii) providing the semiconductor chip; iv) mounting said semiconductor chip with the adhesive layer on the patterned conductive layer such that the semiconductor chip covers at least one of the trenches and part of the contact pads neighboring the respective trench are left uncovered for future wire bonding; v) providing wire bonds between respective terminals of the semiconductor chip and respective contact pads of the substrate carrier; vi) providing a molding compound covering the substrate carrier and the semiconductor chip, and vii) etching the backside of the substrate carrier to expose the molding compound in the trenches. The invention further relates to a semiconductor device manufactured with such method, and to a printed-circuit board comprising such semiconductor device. The invention enables a reduced minimum bondpad pitch. The semiconductor device has a by-design-wettable terminal side at the perimeter of the device. This feature enables automated board inspection wrt board mounting quality. Non-pre-published European patent application 09179896.7 is hereby incorporated by reference in its entirety.

A problem of the known packages in surface-mount technology is that during mounting on a PCB their reliability can not always be guaranteed, i.e. there is a need to further increase the reliability of the packages.

SUMMARY OF THE INVENTION

It is a first object of the invention to provide a method of manufacturing a semiconductor device having an improved reliability. It is a second object of the invention to provide a more reliable semiconductor device and a PCB board comprising such semiconductor device having an improved board level reliability.

The invention is defined by the independent claims. The dependent claims define advantageous embodiments.

In a first aspect, in accordance with the first object, the invention relates to a method as claimed in claim 1.

The effect of the features of the invention is as follows. In the method (constituting part of a packaging method) a photoresist layer is provided with an opening having pre-shaped sidewalls such that, after filling the opening with the electrically conductive material for forming the contact pad, at least one of the further sidewalls of the contact pad comprise a protrusion (contained within the original opening of the photoresist layer) in a direction having a component orthogonal to the respective sidewall. Subsequently, after that the semiconductor chip is provided on the contact pad, a protective compound is provided such that the semiconductor chip is covered, but also at least the protrusion on the respective sidewall (the photoresist layer has been removed by then). As a consequence the contact pad is better locked to the semiconductor chip, which leads to a higher reliability of the packaged semiconductor device. At this stage it must be noted that the prior art discloses more complicated methods where protrusions are formed outside the opening of the photoresist layer. This method of the prior art does not only have the disadvantage of being more complex, also it has the severe disadvantage of resulting in much thicker contacts pads, which increases the costs significantly.

The electrically conductive layer defining the contact pad, may comprise a stack of sublayers, such as a stack comprising a nickel layer with a gold plating (NiAu), or a stack of Nickel, Palladium, Gold (NiPdAu). What is important is that the electrically conductive layer is at least to some extend suitable for locking to the protective compound and suitable for wire-bonding.

In an embodiment of the method in accordance with the invention, in the providing of the photoresist layer, the photoresist layer comprises particles of non-photoresist material, wherein the pre-shaped sidewalls have a rough surface because of the presence of the particles in the photoresist layer in the pre-shaped sidewalls, wherein, in the filling of the opening, the further sidewalls have a further rough surface corresponding with the rough surface of the photoresist layer. This embodiment of the method is a first advantageous way of pre-shaping the sidewalls of the photoresist such that a protrusion (i.e. a lot of protrusions in this embodiment) is formed within the opening during the filling of the opening. It must be noted here that in the methods of the prior art a rough surface of a sidewall of an opening in a photoresist layer is considered as an undesired effect, i.e. the inventors intentionally took a measure which a person skilled in the art would not consider automatically because of its negative effect on the electrical fields. The inventors realized the in the application of packaging these disadvantageous effects are less important and moreover outweighed by the positive locking effect.

In an embodiment of the method in accordance with the invention the particles are flake-shaped or fiber-shaped. Particles of this shape have the advantage that they result in an appropriate rough surface of the sidewalls of the opening in the resist. However, the invention is not restricted to such shapes. Any other suitable shape may be used as long as the particles are shaped such that they can stick into the contact pad material and at least in part remain there after removal (developing) of the photoresist layer in which they were originally contained.

In an embodiment of the method in accordance with the invention the particles comprise material selected from a group comprising: epoxy and glass or any other suitable material. For example ceramic material. What is important is that the material has enough intrinsic strength and, in addition, exhibits proper adhesion to the protective compound and the material of the contact pad.

In an embodiment of the method in accordance with the invention, in the providing of the photoresist layer, the pre-shaped sidewalls of opening are formed in a tapered fashion such that a width of the opening increases towards the first side, wherein, in the filling of the opening, the further sidewalls are formed in a tapered fashion corresponding with the sidewalls of the photoresist layer. This embodiment of the method is a first advantageous way of pre-shaping the sidewalls of the photoresist such that a protrusion (the protrusion is formed by the sharp corners at the first side of the opening) is formed within the opening during the filling of the opening. It must be noted here that in the methods of the prior art a rough surface of a sidewall of an opening in a photoresist layer is considered as an undesired effect, i.e. the inventors intentionally took a measure which a person skilled in the art would not consider automatically because of its negative effect on the electrical fields. The inventors realized the in the application of packaging these disadvantageous effects are less important and moreover outweighed by the positive locking effect.

In an embodiment of the method in accordance with the invention, in the provision of the substrate, the substrate comprises a substantially flat surface at the first side. The provisions of a substrate, such as a copper substrate, with a flat surface ensures that during conventional lithographic processing the sidewalls of the photoresist are formed in a tapered fashion (due to light scattering at the surface of the substrate), i.e. that the width of the opening increases towards the first side. In an embodiment conventional lithographic processing comprises: spin or screen print on a photoresist layer, provide a mask on the photoresist layer, expose the photoresist layer to UV light, and develop the photoresist layer. Conventionally, in case of a copper substrate, in order to prevent tapered sidewalls to be formed, the surface is roughened by means of copper pre-etching as a cleaning step.

An embodiment of the method in accordance with the invention further comprises: etching the second side of the substrate. This embodiment of the method ensures that the contact pads are electrically separated. In a first variant the substrate is completely removed by etching, i.e. a contact region (or multiple contact regions) is formed at the second side of the contact pads. In a second variant the substrate is not completely removed, retaining a part of the substrate at the second side of the contact pad, i.e. the contact region is formed on the second side of the substrate (which is electrically coupled to the respective contact pad). In an advantageous embodiment the etching of the substrate is done selective to the substrate material.

An embodiment of the method in accordance with the invention further comprises, before the providing of the protective compound, providing a wire bond between the terminal of the semiconductor chip and the contact pad of the substrate.

An embodiment of the method in accordance with the invention further comprises:
  providing solder material on a contact region at the second side associated with the contact pad, the solder material being configured for attaching to receiving contacts of a printed-circuit board.

In an embodiment of the method in accordance with the invention the providing of the solder material comprises screen printing solder paste or solder ball placement on the second side of the substrate.

An embodiment of the method in accordance with the invention further comprises:
  heating the semiconductor device to a predefined temperature during a predefined time period to obtain reflow of the solder material for forming solder bumps on the backside of the semiconductor device at locations of the contact region.

An embodiment of the method in accordance with the invention further comprises:
  cutting the semiconductor device outside an area of the contact region for obtaining a packaged semiconductor chip.

In an embodiment of the method in accordance with the invention, during the etching of the backside of the substrate is completely removed such that the contact regions are located directly on the second side of the contact pads.

In a second aspect, in accordance with the second object, the invention relates to a semiconductor device manufactured with the method of the invention.

In a third aspect, in accordance with the second object, the invention relates to a semiconductor device comprising:

a contact pad comprising electrically conductive material having a first side and a second side, the contact pad having at least one tapered sidewall such that a width of the contact pad increases towards the first side;

a semiconductor chip being provided at the first side of the contact pad, the semiconductor chip having a terminal that is electrically connected to the contact pad, and a protective compound covering the semiconductor chip and at least part of the at least one tapered sidewall. This embodiment of the semiconductor device exhibits a good locking of the contact pad and thereby a very reliable device is obtained.

In a fourth aspect, in accordance with the second object, the invention relates to a semiconductor device comprising:

a contact pad comprising electrically conductive material and having a first side and a second side, the contact pad having at least one roughened sidewall;

a semiconductor chip being provided at the first side of the contact pad, the semiconductor chip having a terminal that is electrically connected to the contact pad, and a protective compound covering the semiconductor chip and at least part of the at least one roughened sidewall. This embodiment of the semiconductor device exhibits a good locking of the contact pad and thereby a very reliable device is obtained.

It must be stressed that the tapered sidewall embodiment of the semiconductor device may be advantageously combined with the roughened sidewall embodiment.

In an embodiment of the method in accordance with the invention the roughened sidewall comprises particles, wherein the particles comprise material that is preferably different from the electrically conductive material of the contact pad.

In an embodiment of the method in accordance with the invention the material of the particles is selected from a group comprising: epoxy and glass or any other suitable material. For example ceramic material. What is important is that the material has enough intrinsic strength and, in addition, exhibits proper adhesion to the protective compound and the material of the contact pad.

In a fifth aspect, in accordance with the second object, the invention relates to a printed-circuit board comprising the semiconductor device of the invention, and further comprising a carrier with terminals for receiving said semiconductor device. A more reliable semiconductor device also leads to a more reliable printed-circuit board (PCB) and thus the PCB also benefits from the semiconductor device of the invention.

These and other aspects of the invention are apparent from and will be elucidated with reference to the embodiments described hereinafter.

LIST OF REFERENCE NUMERALS

Figure 1:
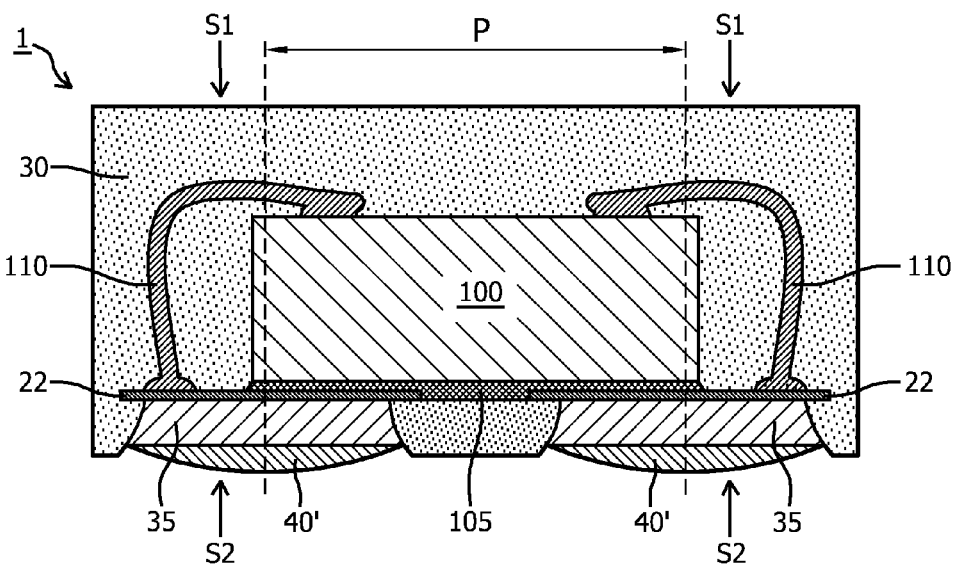
FIG. 1 shows a packaged semiconductor device.

| | |
|---|---|
| S1 | first side |
| S2 | second side |
| 1 | semiconductor device in accordance with first embodiment |
| 10 | substrate (carrier) |
| 15 | photoresist layer |
| 16 | openings in photoresist layer |
| 16' | extension of opening into substrate using (cleaning) etch step |
| 17 | foreign particles (e.g. fibers or flakes) |
| 18 | rough sidewalls of resist (comprising foreign particles) |
| 20 | patterned conductive layer |
| 22 | contact pads with rough sidewalls (first embodiment) |
| 22' | contact pads with tapered sidewalls (second embodiment) |
| 22" | contact pads with tapered and rough sidewalls (third embodiment) |
| 23 | rough sidewalls of patterned conductive layer (for improved locking) |
| 24 | extensions of patterned conductive layer (under photoresist) |
| 26 | tapered sidewalls of patterned conductive layer (for improved locking) |
| 30 | protective compound (molding compound) |
| 33 | rough surface of protective compound (for locking conductive layer) |
| 35 | contact regions (second side of contact pads or substrate if not completely removed) |
| 40' | solder bumps |
| 100 | semiconductor chip |
| 105 | adhesive layer on backside of semiconductor chip 100 |
| 110 | bondwires |
| 200 | PCB |
| 205 | PCB carrier |
| 210 | contact pad of PCB |
| 220 | solder bump on PCB |
| CS | contact surface of contact pad |
| MSPS | mushroom-shaped plating stack |
| GSTS | grass-shaped top-surface |

DETAILED DESCRIPTION OF THE PREFERRED EMBODIMENT

In this description a method of manufacturing a semiconductor device is described in which a semiconductor chip is packaged. In the packaging process terminals are manufactured for connecting the semiconductor chip to the outside world, such as a PCB. This invention focuses on surface mount technology, and in particular to improvements for QFN and QFP packages, which are particularly used for IC's with a low-pincount, i.e. packages with typically between two and twelve (or more) bondpads. In order to keep pace with the ITRS roadmap also the packaging requirements becomes more and more stringent. Lateral dimensions of the package have to shrink. One of such lateral dimensions is the bondpad pitch.

In order to facilitate the discussion of the detailed embodiments a few expressions are defined hereinafter.

In this description the "front-side" of a semiconductor device is defined as the side of the semiconductor device at which the protective compound is provided. This side also being referred to as the first side in this description. The "back-side" of the semiconductor device is defined as the side opposite to the front-side, i.e. where the contact regions are located. This side also being referred to as the second side in this description. It must also be noted that throughout the description the same side definitions are used for the layers and components within the semiconductor device.

In this description the term "plated metal land" is to be interpreted as a contact pad that is build up by plated metal or a metal stack, which is totally or partially embedded in a protective compound.

In this description the term "carrier" is to be interpreted as a substrate on which additive plating processes are possible. In the embodiments discussed in this description the carrier is a sacrificial material in the sense that it is at least partially removed later in the process (forming isolated contact regions).

In this description the term "protective compound" is to be interpreted as a material that serves for protection of assembled semiconductor chips or components within the semiconductor device package.

FIG. 1 shows a packaged semiconductor device. The semiconductor device 1 comprises a semiconductor chip 100 extending towards a first side S1 thereof and two contact terminals 40' at the opposite, second, side S2 of the device, which are intended to be mounted on a PCB without the requirement of having holes in the PCB. Such a device is therefore a surface-mount device (SMD). Furthermore, the contact terminals 40' comprise solder bumps in this example. The provision of the solder bumps on the device itself is advantageous in case the device is soldered to a PCB, in which case a better electrical contact and good terminal wettability is ensured. The contact terminals 40' are each provided on a contact region 35. Each contact region 35 is electrically coupled to a respective contact pad 22, which are each electrically connected with a respective bondwire 110 to a respective terminal (not shown) of the semiconductor chip 100. The semiconductor chip 100 mounted on the contact pads 22 with an adhesive layer 105. The semiconductor chip 100 including the bondwires 110 is covered (encapsulated) with a protective compound 30, such as a molding compound. Examples of such molding compound are: EME6210, MP8000 and G620A, which are commercially available on the market. The contact pads 22 are spaced apart with a contact pitch P that is typically in the range between 200 µm and 2 mm. The molding compound 30 in FIG. 1 extends to beyond the second side S2 of the contact pads 22. In this way the contact pads 22 are locked to the semiconductor device. The invention provides for an even better locking than achieved in this device through modification of the sidewalls of the contact pads 22, but without increasing the contact pad thickness.

Figure 2:
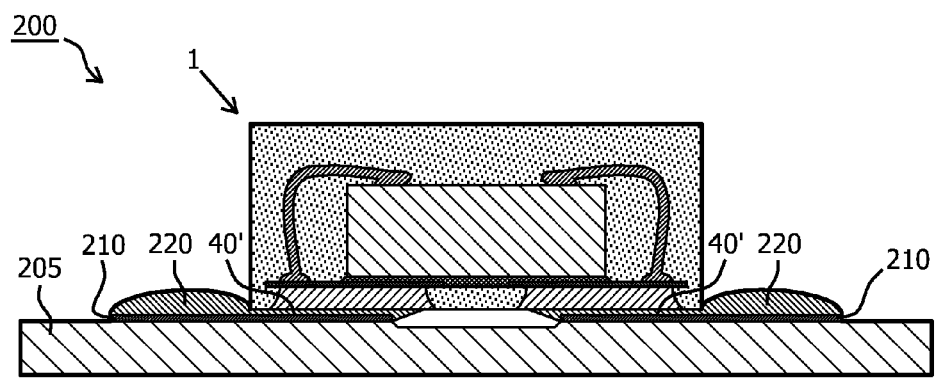
FIG. 2 shows the packaged semiconductor device of FIG. 1 when mounted on a PCB.

FIG. 2 shows the packaged semiconductor device of FIG. 1 when mounted on a PCB. The PCB 200 may comprise many electrical components, mechanical components and connections between them. Furthermore, it may comprise sockets for receiving packaged semiconductor devices of a different kind. All such components and parts have been left out for facilitating understanding of the invention. FIG. 2 shows a PCB carrier 205 having contact pads 210 onto which further solder bumps 220 have been provided. The semiconductor device 1 has been soldered with its solder bumps 40' to the further solder bumps 220 of the PCB. In this soldering process both bumps melt together which provides for a very good electrical contact with a low contact resistance.

Figure 3:
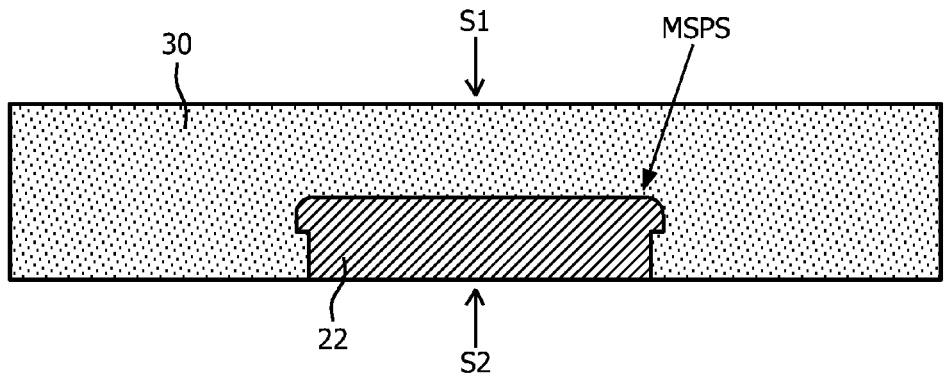
FIG. 3 shows part of a packaged semiconductor device of the prior art.

Concept for improved locking of contact pads (also being referred to as metal lands) have been reported in the prior art. FIG. 3 shows part of a packaged semiconductor device of the prior art. The structure illustrates a component that is to be contacted via the second side S2 as illustrated in the figure. The figure shows one contact pad 22 that is encapsulated by a molding compound 30. Other contact pads and the semiconductor chip (located at the first side S1) have been left out for clarification reasons. The contact pad 22 comprises a mushroom-shaped plating stack MSPS. A severe disadvantage of this device is that the contact pad 22 is formed in multiple steps. In a stage of the manufacturing method an opening in a resist is filled with a conductive material, but after that the opening is completely filled, a further growth step is carried out, i.e. the opening is overfilled with conductive material. In this way the mushroom shaped contact pad 22 is obtained. The thickness of the photoresist layer is typically in the order of 10 to 30 µm, which means that the thickness of the contact pad 22 is typically in the order of 40 to 70 µm. Not only does this imply a more-time consuming growth step, also it makes the packing of the device much more expensive.

Figure 4:
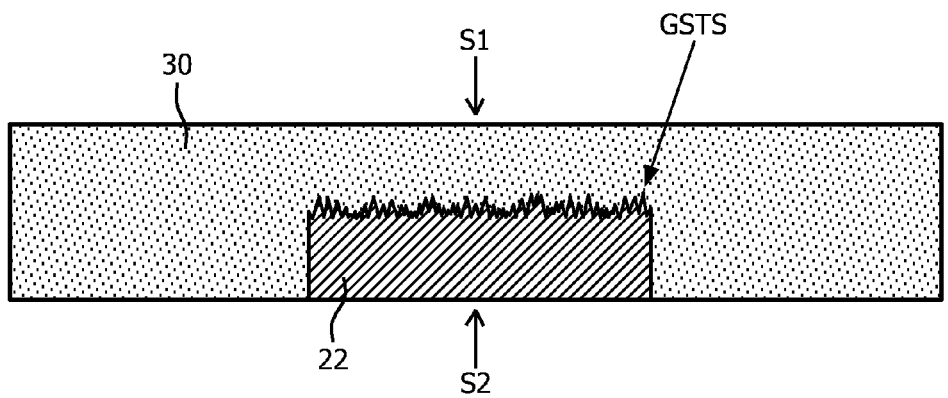
FIG. 4 shows part of a further packaged semiconductor device of the prior art.

FIG. 4 shows part of a further packaged semiconductor device of the prior art. The structure illustrates a component that is to be contacted via the second side S2 as illustrated in the figure. Similar to FIG. 3, the figure shows one contact pad 22 that is encapsulated by a molding compound 30. Also, as in FIG. 3, other contact pads and the semiconductor chip (located at the first side S1) have been left out for clarification reasons. The contact pad 22 comprises a rough (grass-shaped) top-surface GTST. A severe disadvantage of this device is that the locking is not significantly improved by the rough top-surface GTST, i.e. the adhesion between the contact pad and the molding compound 30 is only slightly improved.

In the description herein after two alternative methods for increasing metal land locking into a compound are discussed. Both methods focus on the side walls of the plated lands without increasing its thickness (so remaining within the original opening of the photoresist layer when making the metal land). The methods can be used independently, but may also be combined having an even stronger locking effect as will be discussed with respect to FIG. 7. The methods are discussed in a heavily simplified context, namely only one contact pad that is locked in the compound is considered.

Figure 5A:
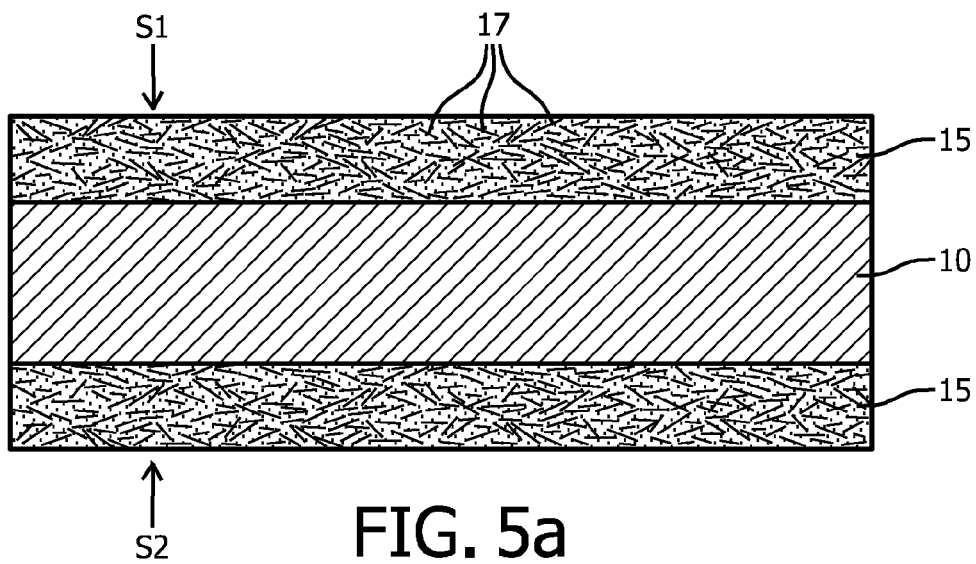
FIGS. 5a to 5f show different stages of a method of manufacturing a semiconductor device in accordance with a first embodiment of the invention.

FIGS. 5a to 5f show different stages of a method of manufacturing a semiconductor device in accordance with a first embodiment of the invention. In the stage of FIG. 5a a substrate 10 (also being referred to as carrier) is provided. The substrate 10 may comprise copper, for example. Other suitable materials are aluminum, iron, steel, bronze, brass, alloys and combinations thereof. The substrate may be 75 µm in an example embodiment. On the substrate 10 there is provided a photoresist layer 15 (a photo image-able plating resist). In the example of FIG. 5 the photoresist layer 15 is provided on both sides S1, S2 of the substrate 10, but this is not essential. The photoresist layer 15 may be provided by a spin-on or screen printing step. The photoresist layer 15 comprises so called filler material or foreign material in the form of particles 17. In this example the particles 17 have an elongate shape, i.e. fiber-shaped. Alternatively, they may be flake-shaped, for example. The dimensions of the fiber-shaped particles 17 may vary. In an embodiment the length of the fibres or flakes is in range of 5 to 50 µm, the width is in the range of 2 to 50 µm, and the height is in the range of 2 to 5 µm. Furthermore, it may comprise materials such as: glass or epoxy or any other suitable material. For example ceramic material. What is important is that the material has enough intrinsic strength and, in addition, exhibits proper adhesion to the protective compound and the material of the contact pad.

Figure 5B:
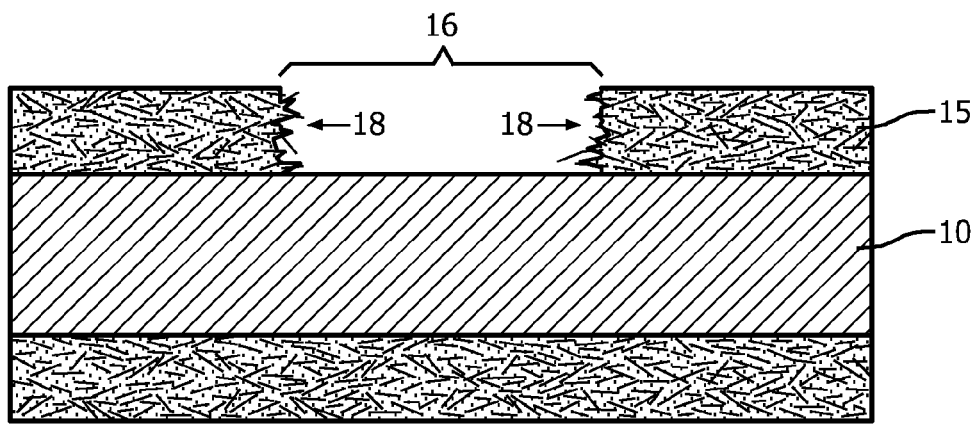

In the stage of FIG. 5b an opening 16 is made in the photoresist layer 16. Conventional lithographic processing steps can be used for this. Because of the presence of the (foreign) particles 17, that do not have the photo-imageable properties of the photoresist, rough sidewalls 18 are formed in the opening as illustrated in the drawing. Foreign material extends into the opening 16 of the photoresist layer 15, but remain partially trapped in the plating resist, which causes the sidewalls to have an increased roughness.

After the stage of FIG. 5b, optionally, a cleaning step (an etch step) may be carried out to clean the surface of the substrate 10 within the opening 16. This improves the adhesion of the contact pad (to be formed later) to the substrate 10.

Figure 5C:
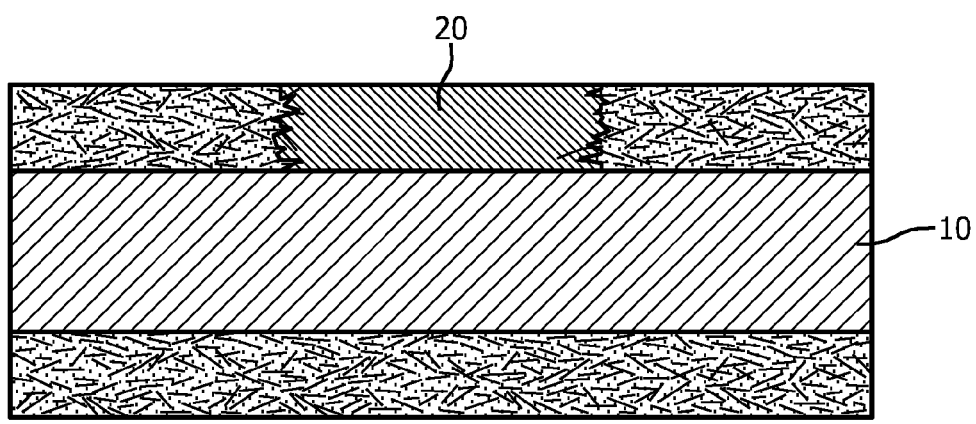

In the stage of FIG. 5c the opening 16 is filled with conductive material 20 defining the contact pad. Such layer may be provided using a plating technique for example, such as electroless plating or electrolytic plating. The patterned conductive layer may comprise materials such as gold, platinum, palladium, nickel, etc. The conductive material may also comprise a stack of sublayers, such as a stack comprising a nickel layer with a gold plating (NiAu), or a stack of Nickel, Palladium, Gold (NiPdAu). What is important is that the conductive layer is suitable for locking to the molding compound and suitable for wire-bonding. The conductive material 20 is provided on a front-side 51 of the semiconductor device 1, which is still an intermediate product at this stage. The back-side S2 is opposite the front-side 51 and is the side on which the contact terminals will be formed in a later stage.

Figure 5D:
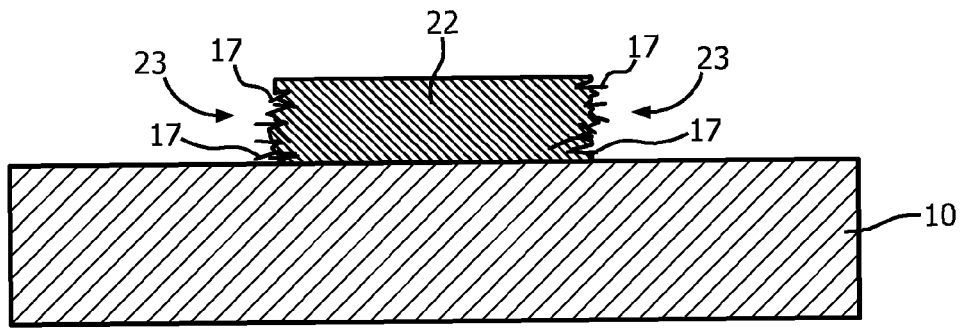

In the stage of FIG. 5d the photoresist layer 15 is removed using conventional lithographic processing steps obtaining the final contact pad 22. As a result of the rough surface of the sidewalls 18 of the photoresist layer 15 the contact pad 22 is formed with further sidewalls 23 having a rough surface that corresponds with the sidewalls of the opening 16. One cause of this rough surface is the presence of part of the particles 17 which remain trapped in the further sidewalls 23 of the contact pad. However, the particles 17 have also induced a surface roughness of the further sidewalls during the manufacturing process (so even if the particles 17 are taken away, the surface is still rough). So effectively, a double-locking feature is obtained in this embodiment of the method. As already mentioned earlier, the particles 17 may have many sizes and shapes, but what is important is that in this step at least part of the fibers 17 remain stuck in the sidewalls of the contact pad 22, when the photoresist is removed.

Figure 5E:
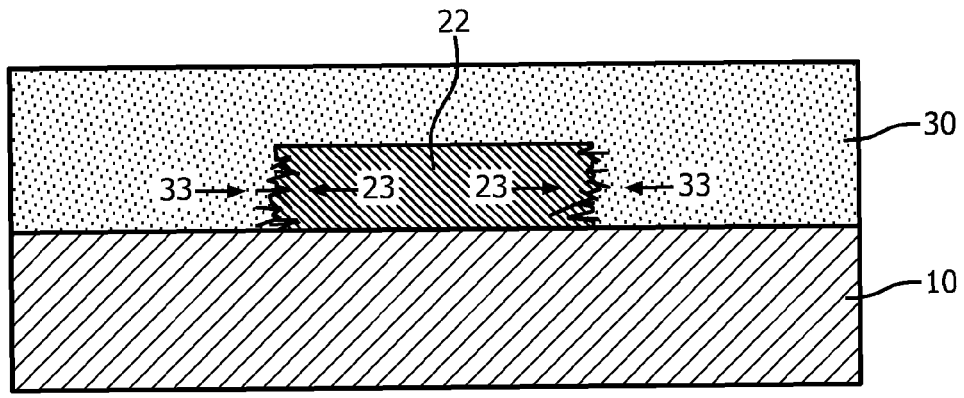

In the stage of FIG. 5e a molding compound is provided which covers the bondpad, the semiconductor chip (not shown) and the bondwires (not shown). Such molding compound may be a thermoplastic or a thermosetting plastic. The technique for providing a molding compound, as such, is considered to be well-known to the person skilled in the art. The molding compound 30 also covers the rough sidewalls 23 of the contact pad 22, and as a consequence of that, the molding compound is also formed with a rough sidewalls 33 which effectively encapsulates the protrusions of the further sidewalls 23 of the contact pad 22, i.e. the contact pad or metal land 22 is better locked into the compound.

Figure 5F:
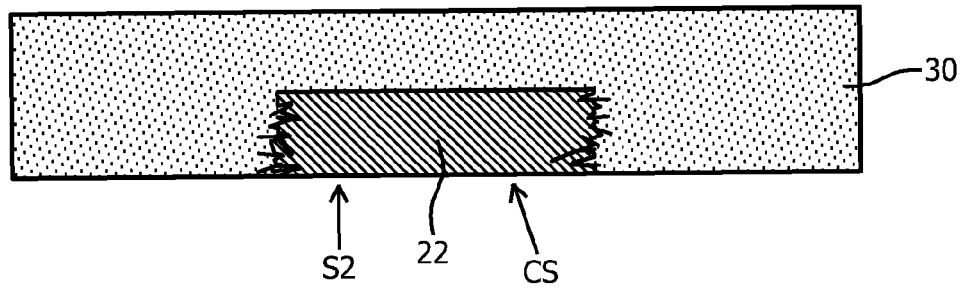

In the stage of FIG. 5f the substrate 10 is etched from the second side S2, exposing a contact surface CS of the contact pad 22 at the second side S2. During this etching step contact regions 35, which were defined earlier in the process during the etching of the trenches 29, are separated from each other. The etching may be done selective to the substrate material 10, but this is not essential.

The method disclosed in FIGS. 5a to 5f improves locking by making the sidewalls rough, but also by introducing foreign material, in the shape of particles, that are fixed in the sidewalls of the metal lands and extend into the compound. The particles originate from the photoresist layer 15.

FIGS. 6a to 6e show different stages of a method of manufacturing a semiconductor device in accordance with a second embodiment of the invention. This method will be mainly discussed in as far as it differs from the method as illustrated in FIGS. 5a to 5e. On top of that a few other aspects which are also valid for the first method will be discussed.

Figure 6A:
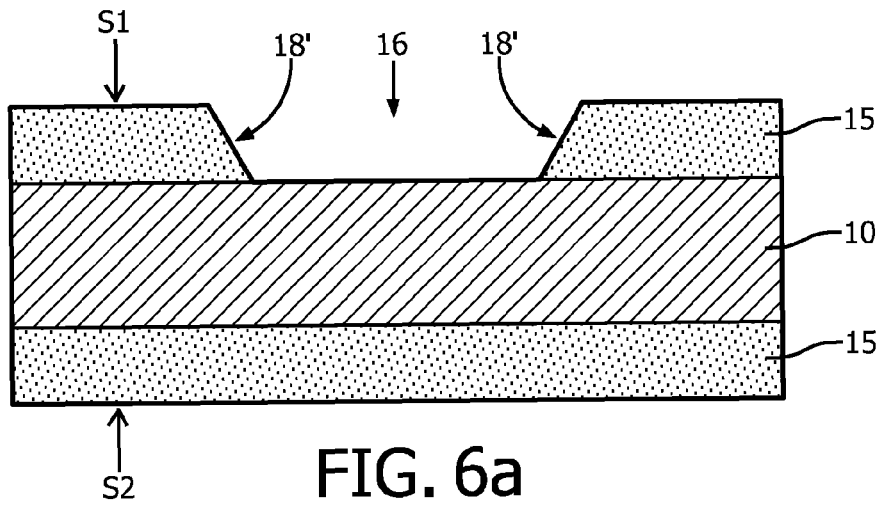
FIGS. 6a to 6e show different stages of a method of manufacturing a semiconductor device in accordance with a second embodiment of the invention.

In the stage of FIG. 6a, which corresponds with the stage of FIG. 5b, an opening 16 is also formed in the photoresist layer 15. However, in this case the photoresist layer 15 does not comprise particles of foreign material. Furthermore, the opening 16 is formed such that the sidewalls 18' of the opening are tapered (wider towards the first side S1. The level of tapering may vary, but in any case the purpose is to form a contact pad having a corresponding tapering effect, which improves the locking within the compound. One way of obtaining the tapered sidewalls 18' is to use a substrate having a flat surface In the case of copper substrates, the copper substrate typically has a rough surface and a flat surface. Conventionally, the rough surface is used for providing the respective layers on. When the surface of the substrate 10 at the first side S1 is flat the light near the sidewalls which is used in the photolithographic process, is typically reflected back, and also under an angle. This typically then results, after developing of the photoresist layer 15, in an opening 16 having tapered sidewalls 18' as illustrated in the drawings. When the surface is rough typically absorption is obtained at the surface, which leads to straight sidewalls.

Figure 6B:
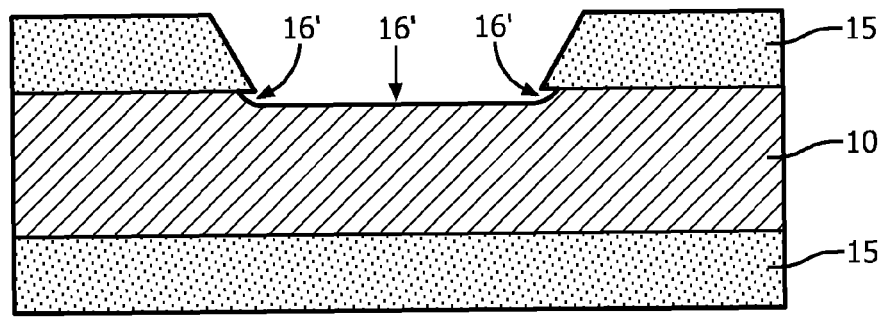

In the stage of FIG. 6b, which does not have a corresponding drawing in FIGS. 5a to 5f, an etching step is carried out, for cleaning the surface of the substrate 10. As a consequence of this step the opening 16 is extended with an extension 16' underneath the photoresist layer 15. This facilitates the forming of an even stronger tapering of the sidewalls of the contact pad 22 to be formed, as will be explained later. It must be noted that this etching step may also be used in the flow as illustrated in FIGS. 5a to 5f, for example between FIG. 5b and FIG. 5c.

Figure 6C:
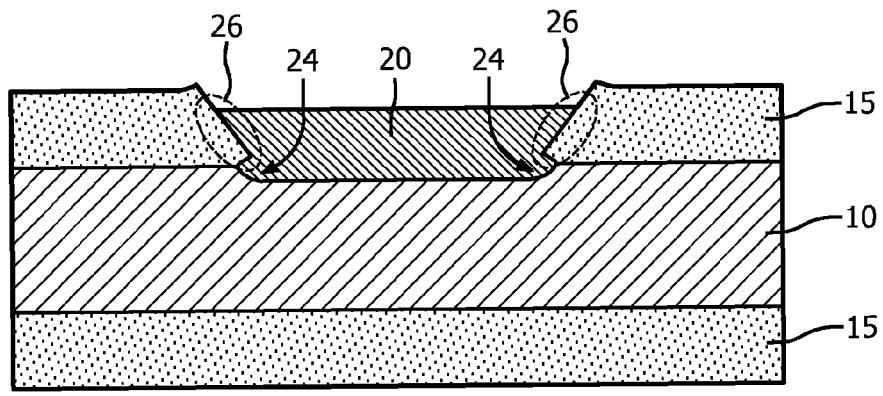

In the stage of FIG. 6c, corresponding with the stage of FIG. 5c, the opening 16 is filled with conductive material 20 defining the contact pad. In this case the further sidewalls 26 of the contact pad to be formed are tapered corresponding with the tapered sidewalls 18' of the photoresist layer 15. Another aspect in this stage is that the extensions 16' underneath the photoresist layer 15 are filled with conductive material thus forming extensions of the patterned conductive layer 24.

Figure 6D:
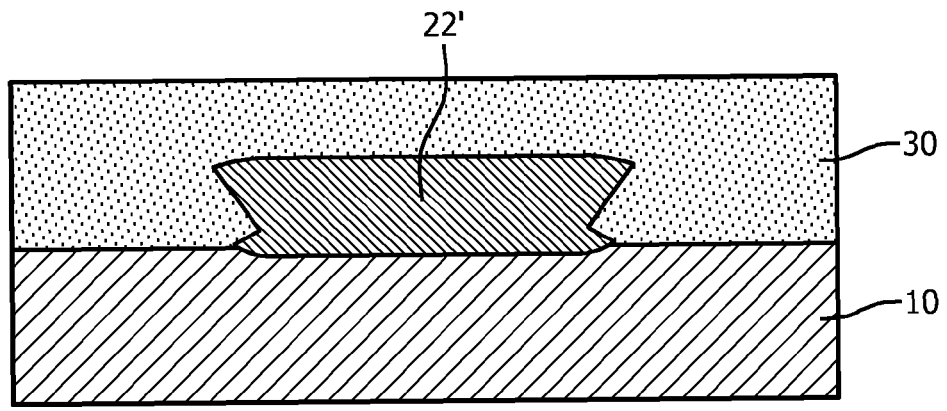

In the stage of FIG. 6d, corresponding with the stage of FIG. 5e, the photoresist layer 15 has been removed, completing the formation of the contact pad 22' with the tapered sidewalls and the extensions.

Figure 6E:
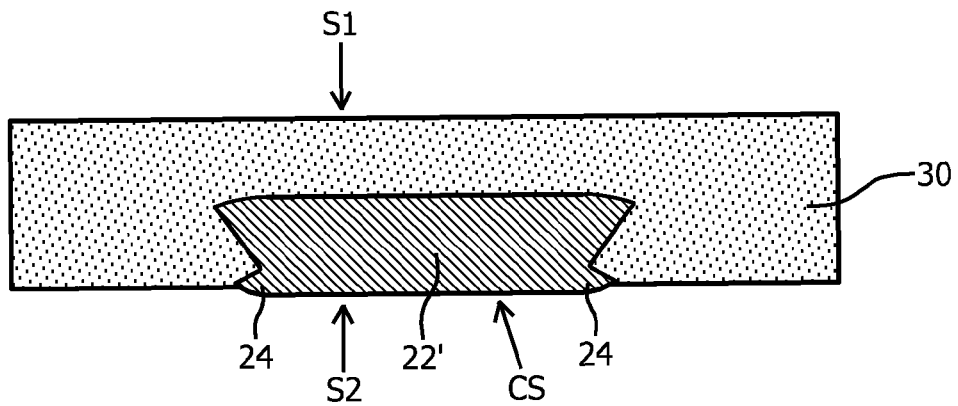

In the stage of FIG. 6e, corresponding with the stage of FIG. 5f, the substrate 10 is removed. The extensions 24 of the contact pad do not contribute to improved locking in most embodiments, because the extensions are not encapsulated in the molding compound. However, in some embodiments the extensions contribute to improved locked, in particular in embodiments as disclosed in non-pre-published European patent application 09179896.7, wherein the molding compound extends to beyond the second side S2 of the contact pads 22.

The method disclosed in FIGS. 5a to 5f improves locking by making tapered sidewalls such that a width of the contact pad increases towards the first side S1, i.e. away from the surface which is provided with solder material. Any extensions 24 at the second side which are not encapsulated by the molding compound 30 are not considered.

The methods of FIG. 5 and FIG. 6 have in common that the sidewalls of the opening are pre-shaped such that within the opening of the photoresist the contact pads 22 are formed with a protrusion extending in a direction orthogonal to the sidewall. Expressed differently, sidewalls of the contact pads are pre-shaped without changing the thickness of the contact pads.

Figure 7:
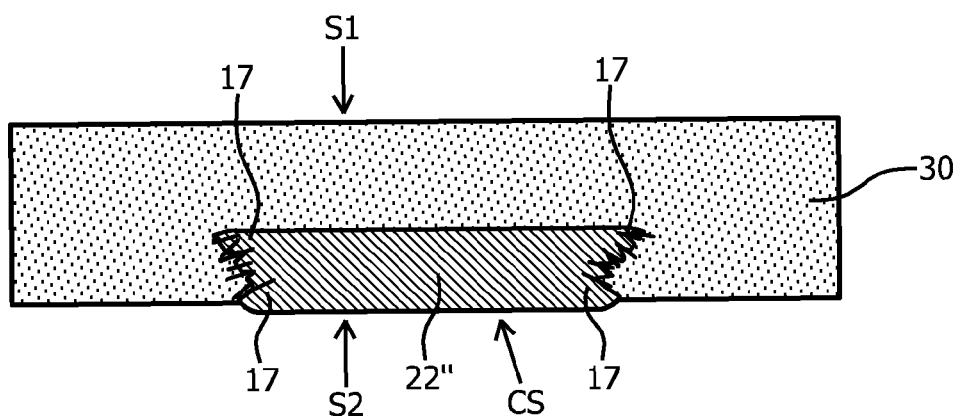
FIG. 7 shows a stage of a method of manufacturing a semiconductor device in accordance with a third embodiment of the invention, which is a combination of the first and second embodiment.

FIG. 7 shows a stage of a method of manufacturing a semiconductor device in accordance with a third embodiment of the invention, which is a combination of the first and second embodiment. So, effectively, this embodiment follows the flow of FIGS. 6a to 6e, wherein in the stage of FIG. 6a the photoresist is provided with particles of foreign material as explain with respect to FIG. 5b. The resulting device comprises a contact pad 22'' having rough tapered sidewalls including the trapped particles with foreign material, which are strongly locked into the molding compound 30.

It must be noted at this stage that the methods as illustrated in FIGS. 5, 6, and 7 are very suitable for manufacturing a plurality of semiconductor devices 1 in parallel. The substrate 10 and contact pads 22 may be designed for mounting many semiconductor chips 100 in this stage of the method. Nevertheless, for the sake of simplicity in this description reference is made to the singular form of "semiconductor device". Also, reference is made to this term whereas in most cases an intermediate stage of this semiconductor device is meant.

Further Processing Steps

The devices as illustrated in FIGS. 5f, 6e, and 7 are not yet ready to be mounted on a carrier such as a PCB. In particular function plating has not been elaborated on in detail. Function plating comprises surface die bonding and wire bonding. A semiconductor chip 100 (also referred to as "die") comprising an adhesive layer is mounted on the contact pads. In an embodiment, on a top-side of the semiconductor chip there are terminals which are connected with wire bonds to the contact pads. The adhesive layer may comprise of a pre-applied adhesive on wafer level prior to die dicing. The semiconductor chip may comprise circuitry for performing circuit functions in a system (not shown).

Furthermore, solder material may be screen printed on the back-side of the semiconductor device 1. Screen printing is a very suitable technique. The solder material preferably comprises leadless tin. It must be noted that the invention is not limited to screen printing in this stage of the method. A so-called reflow-step may be carried out. The semiconductor device 1 is heated to a temperature in the range between 215° C. and 260° C. during a time period of 5 s to 60 s. In this heating step the solder material will reflow to form solder bumps 40' on the backside S2 of the semiconductor device 1. The advantage of using screen printing and reflow is that a relatively expensive finishing technology is rendered superfluous. Expensive finishing is NiPdAu or NiAu. Having such plating at the terminal side implies that the plating step needs to be performed after the etching step of the substrate or that the plating was done prior to receiving the carrier as a step before making the patterned conductive layer. It is known that the finishing done in such a way will result in a material diffusion of the substrate into the finishing stack which has a negative effect on the wettability of the terminal which is eventually offered to the end customer.

Furthermore, the semiconductor device 1 may be cut (in particular when more than 1 device is made using a single substrate 10. Cut lines are typically located outside an area of the contact regions 35. After cutting, the semiconductor device 1 is a packaged semiconductor chip 100 and is ready for being (surface)-mounted on a PCB, which has already been discussed.

The invention thus provides a method of manufacturing a semiconductor device 1, the method comprising: i) providing a substrate 10; ii) providing a photoresist layer 15 on the substrate 10, the photoresist layer 15 comprising an opening 16 having pre-shaped sidewalls 18; iii) filling the opening 16 with an electrically conductive material 20 for defining a contact pad 22 having further sidewalls 23, 26 corresponding with the pre-shaped sidewalls 18. The sidewalls 18 are pre-shaped such that the further sidewalls 23, 26 contained within the opening 16 are formed with a protrusion; iv) removing the photoresist layer 15; v) providing the semiconductor chip 100 and mounting said semiconductor chip 100 on the substrate 10 such that one terminal is electrically connected to the contact pad 22, and vi) providing a molding compound 30 covering the substrate 10 and the semiconductor chip 100 and at least the protrusion of at least one of the further sidewalls 23, 26 of the contact pad 22. The invention further provides a semiconductor device 1 manufactured with such method. The semiconductor device 1 comprises: a) a contact pad 22 pre-shaped sidewalls 26; b) a semiconductor chip 100 having a terminal that is electrically connected to the contact pad 22, and c) a protective compound 30 covering the semiconductor chip 100 and at least part of the sidewalls 26. In a first embodiment the sidewall is rough and in a second embodiment the sidewall is tapered. The invention further provides a PCB 200 comprising such semiconductor device 1. The invention facilitates better locking of the contact pad 22 into the compound 30.

The invention may be applied in various application areas. For example, the invention may be applied in semiconductor device manufacturing, and in particular in the packaging of surface-mountable semiconductor devices with a low pin-count, i.e. core-limited designs.

Various variations of the invention are possible and do not depart from the scope of the invention as claimed.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage. Throughout the Figures, similar or corresponding features are indicated by same reference numerals or labels.

The invention claimed is:

1. A method of manufacturing a semiconductor device including a semiconductor chip, the method comprising:
providing a substrate having a first side and a second side opposite to the first side;
providing a photoresist layer on the first side of the substrate, the photoresist layer including an opening extending to the substrate and having pre-shaped sidewalls;
filling the opening with an electrically conductive material for defining a contact pad to be formed for being connected to a terminal of a semiconductor chip, wherein the contact pad has further sidewalls that correspond to the pre-shaped sidewalls of the photoresist layer, wherein the sidewalls of the photoresist layer are pre-shaped such that the further sidewalls contained within the opening are formed with a protrusion in a direction having a component orthogonal to the respective sidewall;

removing the photoresist layer;

providing the semiconductor chip and mounting said semiconductor chip on the first side of the substrate such that one terminal is electrically connected to the contact pad; and providing a protective compound covering the substrate and the semiconductor chip and at least the protrusion of at least one of the further sidewalls of the contact pad, the further sidewalls and the protective compound being configured and arranged to secure the semiconductor chip to the contact pad.

2. The method as claimed in claim 1, wherein, in the providing of the photoresist layer, the photoresist layer comprises particles of non-photoresist material, wherein the pre-shaped sidewalls have a rough surface because of the presence of the particles in the photoresist layer in the pre-shaped sidewalls, wherein, in the filling of the opening, the further sidewalls have a further rough surface corresponding with the rough surface of the photoresist layer.

3. The method as claimed in claim 2, wherein the particles are one of flake-shaped and fiber-shaped.

4. The method as claimed in claim 3, wherein the particles include at least one of epoxy and glass.

5. The method as claimed in claim 1, wherein, in the providing of the photoresist layer, the pre-shaped sidewalls of opening are formed in a tapered fashion such that a width of the opening increases towards the first side, wherein, in the filling of the opening, the further sidewalls are formed in a tapered fashion corresponding with the sidewalls of the photoresist layer.

6. The method as claimed in claim 5, wherein, in the provision of the substrate, the substrate comprises a substantially flat surface at the first side.

7. The method as claimed in claim 1, further comprising: etching the second side of the substrate.

8. The method as claimed in claim 1, further comprising, before the providing of the protective compound, providing a wire bond between the terminal of the semiconductor chip and the contact pad of the substrate.

9. A semiconductor device comprising:
a contact pad including electrically conductive material having a first side and a second side, the contact pad having at least one tapered sidewall such that a width of the contact pad increases towards the first side;
a semiconductor chip being provided at the first side of the contact pad, the semiconductor chip having a terminal that is electrically connected to the contact pad; and
a protective compound covering the semiconductor chip and at least part of the at least one tapered sidewall, the protective compound and the at least one tapered sidewall being configured and arranged to secure the semiconductor chip to the contact pad.

10. A semiconductor device comprising:
a contact pad including electrically conductive material and having a first side and a second side, the contact pad having at least one roughened sidewall;
a semiconductor chip being provided at the first side of the contact pad, the semiconductor chip having a terminal that is electrically connected to the contact pad; and
a protective compound covering the semiconductor chip and at least part of the at least one roughened sidewall, the protective compound and the at least one roughened sidewall being configured and arranged to secure the semiconductor chip to the contact pad.

11. The semiconductor device as claimed in claim 10, wherein the roughened sidewall includes particles, wherein the particles include material that is different from the electrically conductive material of the contact pad.

12. The semiconductor device as claimed in claim 11, wherein the material of the particles includes at least one of epoxy and glass.

13. A printed-circuit board comprising the semiconductor device as claimed in claim 10, and further comprising a carrier with terminals for receiving said semiconductor device.

14. The semiconductor device as claimed in claim 9, wherein the contact pad further includes a portion that extends laterally beyond the semiconductor chip, and further including a bond wire that electrically connects the terminal to the contact pad at a location on the first side of the portion of the contact pad that extends laterally beyond the semiconductor chip.

15. The semiconductor device as claimed in claim 14, wherein the contact pad further includes a portion that extends laterally beyond the semiconductor chip, and further includes a portion of the protective compound that is in contact with the second side of the contact pad and extends laterally along the second side of the contact pad from the sidewall of the contact pad toward a center point of the contact pad.

16. The semiconductor device as claimed in claim 9, further including a contact region electrically coupled to the second side of the contact pad and laterally supported by a portion of the protective compound, the contact region having a solder bump configured and arranged for connection to a printed circuit board.

17. The semiconductor device as claimed in claim 10, wherein the contact pad further includes a portion that extends laterally beyond the semiconductor chip, and further includes a bond wire that electrically connects the terminal to the contact pad at a location on the first side of the portion of the contact pad that extends laterally beyond the semiconductor chip.

18. The semiconductor device as claimed in claim 17, wherein the contact pad further includes a portion that extends laterally beyond the semiconductor chip, and further includes a portion of the protective compound that is in contact with the second side of the contact pad and extends laterally along the second side of the contact pad from the sidewall of the contact pad toward a center point of the contact pad.

19. The semiconductor device as claimed in claim 10, further including a contact region electrically coupled to the second side of the contact pad and laterally supported by a portion of the protective compound, the contact region having a solder bump configured and arranged for connection to a printed circuit board.

* * * * *